United States Patent
Shrivastava et al.

(10) Patent No.: US 11,031,493 B2
(45) Date of Patent: Jun. 8, 2021

(54) DOPING AND TRAP PROFILE ENGINEERING IN GAN BUFFER TO MAXIMIZE ALGAN/GAN HEMT EPI STACK BREAKDOWN VOLTAGE

(71) Applicant: Indian Institute of Science, Bangalore (IN)

(72) Inventors: Mayank Shrivastava, Bangalore (IN); Vipin Joshi, Bangalore (IN)

(*) Notice: Subject to any disclaimer, the term of this patent is extended or adjusted under 35 U.S.C. 154(b) by 0 days.

(21) Appl. No.: 16/431,151

(22) Filed: Jun. 4, 2019

(65) Prior Publication Data
US 2019/0371930 A1    Dec. 5, 2019

(30) Foreign Application Priority Data

Jun. 5, 2018   (IN) .............................. 201841020899

(51) Int. Cl.
| | |
|---|---|
| *H01L 29/778* | (2006.01) |
| *H01L 29/20* | (2006.01) |
| *H01L 29/205* | (2006.01) |
| *H01L 29/207* | (2006.01) |

(52) U.S. Cl.
CPC ...... *H01L 29/7787* (2013.01); *H01L 29/2003* (2013.01); *H01L 29/205* (2013.01); *H01L 29/207* (2013.01)

(58) Field of Classification Search
CPC ............ H01L 29/7787; H01L 29/2003; H01L 29/205; H01L 29/207
USPC ........................................................... 257/76
See application file for complete search history.

(56) References Cited

U.S. PATENT DOCUMENTS

| | | | | |
|---|---|---|---|---|
| 2015/0303293 A1* | 10/2015 | Tanaka | ................ | H01L 29/7787 257/76 |
| 2016/0172478 A1* | 6/2016 | Kotani | .................. | H01L 29/207 257/190 |

* cited by examiner

*Primary Examiner* — Tong-Ho Kim
(74) *Attorney, Agent, or Firm* — Bergman LLC; Michael Bergman

(57) ABSTRACT

The present invention proposes a set of impurity doping configurations for GaN buffer in an AlGaN/GaN HEMT device to improve breakdown characteristics of the device. The breakdown characteristics depend on a unique mix of donor and acceptor traps and using carbon as a dopant increases both donor and acceptor trap concentrations, resulting in a trade-off in breakdown voltage improvement and device performance. A modified silicon and carbon co-doping is proposed, which enables independent control over donor and acceptor trap concentrations in the buffer, thus potentially improving breakdown characteristics of the device without adversely affecting the device performance.

13 Claims, 14 Drawing Sheets

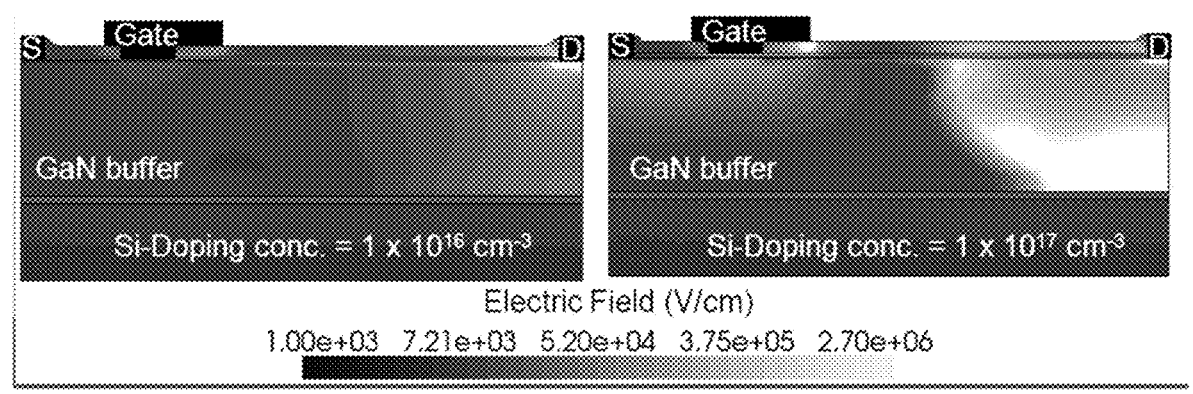
FIG. 4A                    FIG. 4B

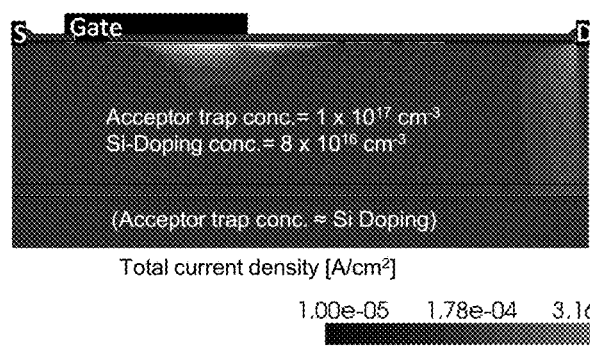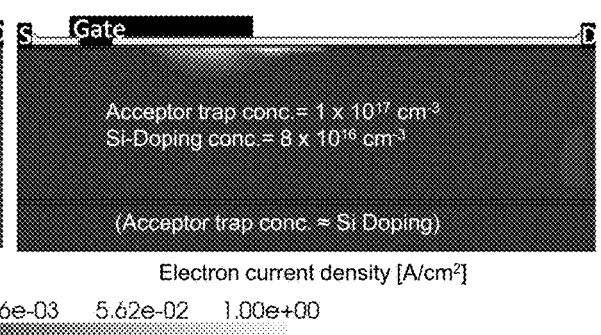
FIG. 8A FIG. 8B
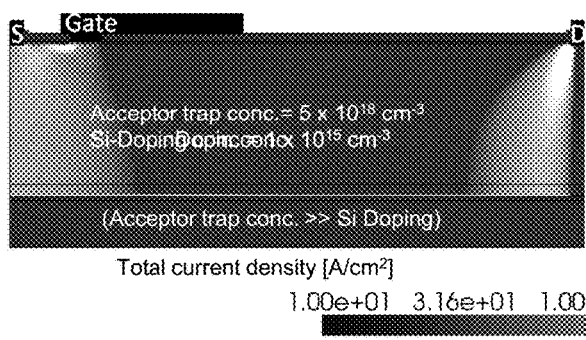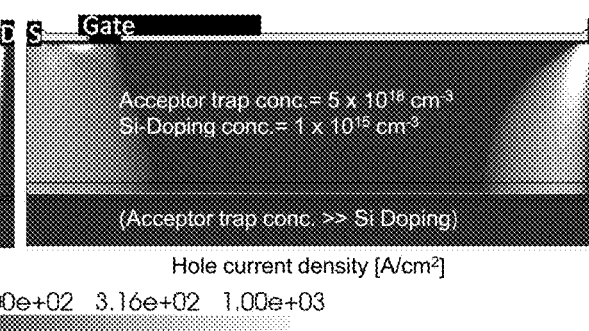
FIG. 8C FIG. 8D

US 11,031,493 B2

DOPING AND TRAP PROFILE ENGINEERING IN GAN BUFFER TO MAXIMIZE ALGAN/GAN HEMT EPI STACK BREAKDOWN VOLTAGE

TECHNICAL FIELD

The present invention relates, generally, to engineering doping profile of a GaN buffer layer of a device. In particular, it relates to co-doping a region of carbon doped area in the GaN buffer layer with silicon, in order to improve breakdown voltage characteristics of the device and minimise its leakage current.

BACKGROUND

Background description includes information that may be useful in understanding the present invention. It is not an admission that any of the information provided herein is prior art or relevant to the presently claimed invention, or that any publication specifically or implicitly referenced is prior art.

For high breakdown voltages with low ON resistance in AlGaN/GaN high electron mobility transistors ("HEMT"), it is recommended to have a highly resistive GaN buffer layer. However, standard growth conditions for GaN buffer generally results in unintentional doping ("UID"), resulting in an increase in buffer leakage and a consequent decrease in breakdown voltage.

Compensation doping of the buffer layer is a commonly employed technique to increase the resistivity of the GaN layer. Carbon (C) is a widely used compensation dopant to increase buffer resistivity and improve breakdown voltage characteristics of the AlGaN/GaN HEMT by reducing buffer leakage.

Carbon doping works by introducing deep acceptor traps in the buffer layer. However, to achieve any significant improvement in the breakdown voltage of the device, a high doping concentration of carbon is required. The traps induced by carbon doping are self-compensating, which is a key parameter in controlling breakdown voltage.

Donor traps have a major role in delayed avalanche action due to relaxation of the vertical electric field, without which, there is no significant improvement in breakdown characteristics of the device.

The acceptor traps have little impact on the avalanche process; they are necessary, rather, to support donor trap concentration by compensating free charge carriers introduced by donor traps in the GaN buffer. Further, increase in acceptor traps in the GaN buffer can cause issues to device performance such as DC-RF dispersion, current collapse, hot electron induced effects, performance degradation, Kink effect etc. Thus, a breakdown improvement of the device due to carbon doping is necessarily a compromise with device performance.

There is therefore a requirement in the art to independently control donor and acceptor trap concentrations in the GaN buffer so that the trade-off between breakdown voltage improvement and device performance is minimised.

In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

OBJECTS

A general object of the present disclosure is to provide a high electron mobility transistor (HEMT) with improved breakdown voltage characteristics.

Another object of the present disclosure is to provide an HEMT with minimised leakage current.

Another object of the present disclosure is to provide an HEMT with minimized dynamic ON resistance.

Another object of the present disclosure is to provide a doping methodology for the HEMT for better performance.

Another object of the present disclosure is to provide a doping methodology for the HEMT to independently control donor and acceptor trap concentrations.

SUMMARY

The present invention relates, generally, to engineering doping profile of a GaN buffer layer of a device. In particular, it relates to co-doping a region of carbon doped area in the GaN buffer layer with silicon, in order to improve breakdown voltage characteristics of the device and minimise its leakage current.

In an aspect, the present disclosure provides a transistor with an improved breakdown voltage, said transistor having an AlGaN barrier layer and a GaN buffer layer, wherein C-doping is performed in said buffer layer for controlling acceptor trap concentration in said buffer layer, and wherein an intentional n-type doping is performed in said buffer layer for controlling donor trap concentration in said buffer layer. In an embodiment, said transistor can be a high electron mobility transistor (HEMT).

In another aspect, the n-type doping is performed based on free hole density and ionized acceptor trap density in said buffer layer.

In another aspect, the region where the n-type doping is performed at least partially overlaps with the area where the C-doping is performed. In an embodiment, the intentional n-type dopant used can be Silicon (Si).

In another aspect, the acceptor trap concentration is minimized while maintaining high breakdown voltage.

In another aspect, the C-doping is optimized based on any or a combination of Source/Drain leakage and breakdown voltage.

In another aspect, the Si-doping is optimised based on dynamic ON resistance.

In another aspect, the channel thickness of said transistor is controlled based on impact of n-type doping on channel mobility.

In another aspect, the C-doping is optimally reduced so as to not impact the improved breakdown voltage beyond a defined threshold.

Various objects, features, aspects and advantages of the inventive subject matter will become more apparent from the following detailed description of preferred embodiments, along with the accompanying drawing figures in which like numerals represent like components.

BRIEF DESCRIPTION OF DRAWINGS

The accompanying drawings are included to provide a further understanding of the present disclosure and are incorporated in and constitute a part of this specification. The drawings illustrate exemplary embodiments of the present disclosure and, together with the description, serve to explain the principles of the present disclosure.

FIGS. 4A and 4B illustrate electric field contours extracted for a fixed acceptor trap concentration in the carbon doped region for different silicon doping concentrations.

FIGS. 8A and 8B illustrate total current density and electron current density respectively, when acceptor trap concentration is similar to silicon doping concentration.

FIGS. 8C and 8D illustrate the total current density and hole current density respectively, when acceptor trap concentration is significantly higher than silicon doping concentration.

DETAILED DESCRIPTION

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Various terms as used herein are shown below. To the extent a term used in a claim is not defined below, it should be given the broadest definition persons in the pertinent art have given that term as reflected in printed publications and issued patents at the time of filing.

Embodiments described herein generally relate to engineering doping profile of a GaN buffer layer of a device. In particular, they relate to co-doping a region of carbon doped area in the GaN buffer layer with silicon, in order to improve breakdown voltage characteristics of the device, minimise its leakage current and improve dynamic ON resistance of the device.

For high breakdown voltages with low ON resistance in AlGaN/GaN high electron mobility transistors ("HEMT"), it is recommended to have a highly resistive GaN buffer layer. However, standard growth conditions for GaN buffer generally results in unintentional doping ("UID"), resulting in an increase in buffer leakage and a consequent decrease in breakdown voltage.

Compensation doping of the buffer layer is a commonly employed technique to increase the resistivity of the GaN layer. Carbon (C) is a widely used compensation dopant to increase buffer resistivity and improve breakdown voltage characteristics of the AlGaN/GaN HEMT by reducing buffer leakage.

Improvement in breakdown voltage is achieved by reducing acceptor trap concentration, while maximising donor trap concentration. However, carbon doping in GaN buffer is a function of process conditions. Under typical growth of GaN buffer, carbon is less likely to behave as donor type trap site in the GaN buffer, while it is more likely to increase concentration of acceptor traps. This results in a higher concentration of acceptor traps for a given carbon doping concentration, causing a trade-off of device performance parameters with improvement in breakdown voltage characteristics.

A viable remedy for the above stated problem is to have separate doping sources to control donor and acceptor trap concentrations in the GaN buffer. This will reduce the carbon doping requirement and can potentially minimise the trade-off between improvement in breakdown voltage and device performance.

Figure 1:
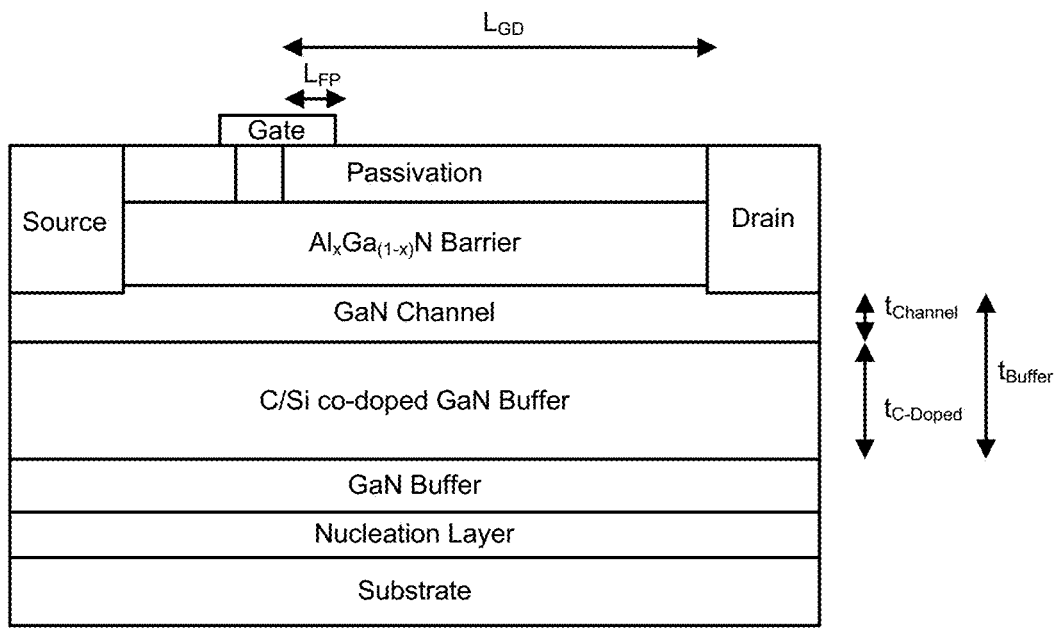
FIG. 1 illustrates an exemplary schematic of an AlGaN/GaN HEMT device.

FIG. 1 illustrates an exemplary schematic of an AlGaN/GaN HEMT device. In an embodiment, the device has the following design parameters: source to gate distance ($L_{SG}$) of 1 µm; gate length ($L_{Gate}$) of 0.7 µm; gate to drain distance ($L_{GD}$) of 5 µm; length of field plate ($L_{FP}$) of 0.6 µm; channel thickness ($t_{Channel}$) of 35 nm; and thickness of carbon doping ($t_{C\text{-}Doped}$) of 1.5 µm. The GaN buffer has an n-type unintentional doping concentration of $1\times10^{15}$ cm$^{-3}$.

In an aspect, donor traps occurring due to carbon doping serve to address two issues: compensating for excess hole density due to acceptor traps; and enabling vertical field relaxation by the modulation of space-charge profile.

In another aspect, since the donor traps are shallow traps with activation energy of approximately 0.11 eV, compared to the conduction band edge, the presence of said donor traps are equivalent to n-type doping of the GaN buffer.

In another aspect, the equivalent n-type doping of the GaN buffer can also be achieved by using dopants such as silicon (Si). This will allow for bringing down the requirement of carbon doping, as now carbon doping is required only for acceptor traps which have a lower formation energy than the donor traps. Further, reduced carbon doping has the potential to improve channel performance.

In an embodiment, silicon doping is done only on regions where carbon doping is already present. The remaining areas of the buffer have a lower unintentional doping concentration. In another embodiment, the lower unintentional doping concentration can be approximately $1\times10^{15}$ cm$^{-3}$.

Figure 2:
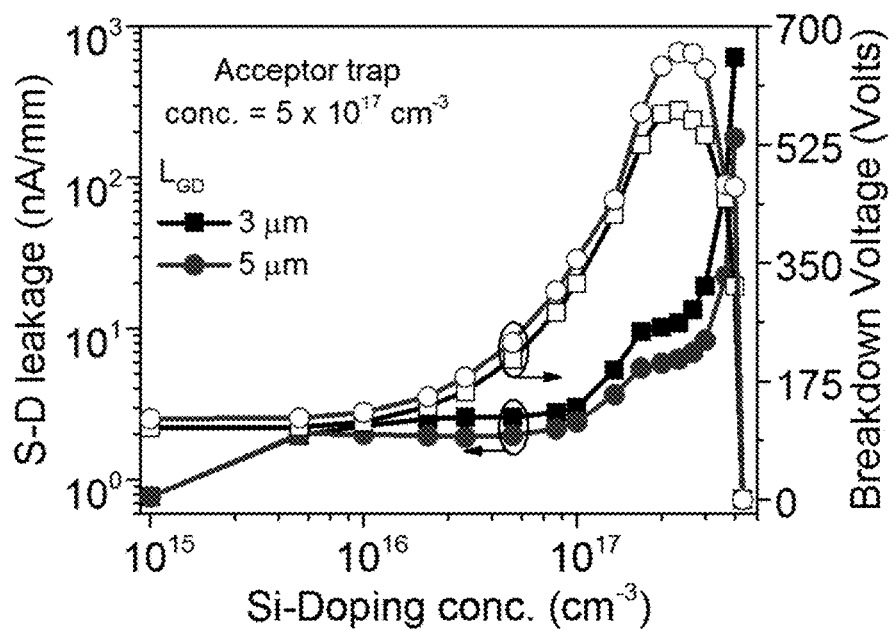
FIG. 2 illustrates the impact of silicon doping concentration on breakdown voltage of the device, when the acceptor trap concentration is fixed.

FIG. 2 illustrates the impact of silicon doping concentration on breakdown voltage of the device, when the acceptor trap concentration is fixed. In an embodiment, the increase in concentration of silicon doping correlates directly with increase in breakdown voltage of the device.

In another embodiment, it is further observed that, as gate to drain distance is scaled, the breakdown voltage of the device is also scaled, with increase in silicon doping concentrations. This signifies that there is a redistribution of electric field in the vertical direction of the GaN buffer.

In another embodiment, as the silicon doping concentration approaches the concentration of acceptor traps, it is observed that breakdown voltage of the device drops to lower values, which is a result of increase in leakage current.

In an aspect, it can be inferred that silicon doping along with carbon doping induced acceptor traps (or, "silicon co-doping") can improve breakdown voltage characteristics of a device. However, it is also noted that the maximum silicon doping concentration is limited to the acceptor trap concentration due to carbon doping.

Figure 3A:
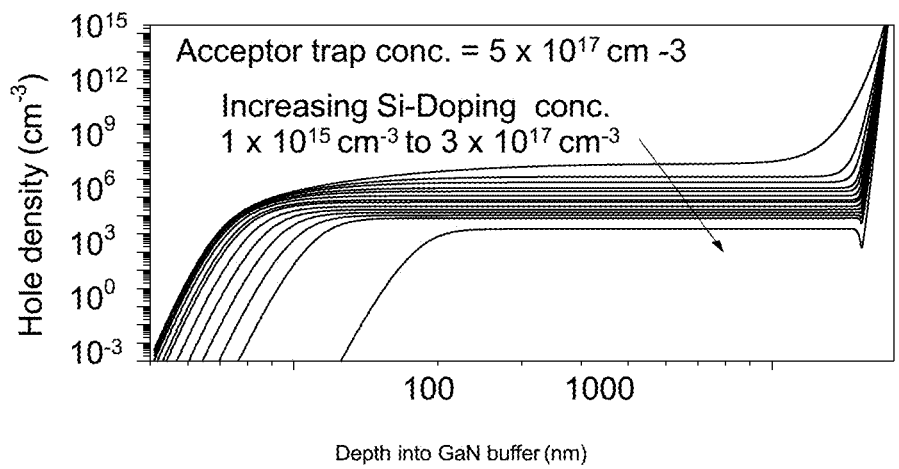
FIGS. 3A and 3B illustrate the effect of silicon co-doping on parasitic hole density and ionised acceptor trap density respectively, in the GaN buffer.
Figure 3B:
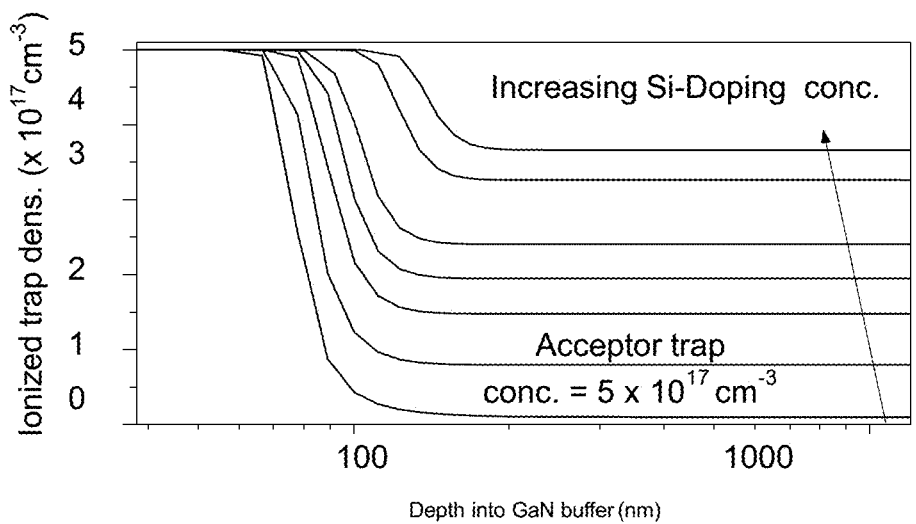

FIGS. 3A and 3B illustrate the effect of silicon co-doping on parasitic hole density and ionised acceptor trap density respectively, in the GaN buffer. In an aspect, GaN buffer characteristics can be affected by silicon co-doping in the following ways: changing the parasitic electron and hole density in the GaN buffer; and modulating, as an ionised dopant, the space charge distribution and vertical electric field in the GaN buffer.

In another aspect, the effects of changing parasitic electron and hole density in the GaN buffer can be evaluated by observing the free hole density and ionised acceptor trap density in GaN buffer as a function of silicon doping concentrations. FIG. 3A illustrates that the free hole density in the GaN buffer that is induced by acceptor traps, is compensated by silicon doping, thus maintaining the buffer resistivity.

FIG. 3B depicts an increase in ionised acceptor trap concentration with silicon doping concentration, wherein the excess free electrons induced by the silicon doping are trapped by acceptor traps already present in the GaN buffer due to carbon doping.

In another aspect, the above conditions hold good only until the silicon doping concentration is less than the acceptor trap concentration, further emphasizing the limit imposed on maximum silicon doping concentration, as seen in FIG. 2.

FIGS. 4A and 4B illustrate electric field contours extracted for a fixed acceptor trap concentration in the carbon doped region for different silicon doping concentrations. FIGS. 4A and 4B illustrate electric field contours for silicon doping concentrations of $1\times10^{16}$ cm$^{-3}$ and $1\times10^{17}$ cm$^{-3}$ respectively.

In an aspect, FIGS. 4A and 4B depict the impact of silicon doping on vertical electric field for different silicon doping concentrations ($1\times10^{16}$ cm$^{-3}$ and $1\times10^{17}$ cm$^{-3}$ respectively) and compares electric field contours for various silicon doping concentrations. In an embodiment, it can be inferred that, as silicon doping concentration increases, vertical electric distribution in the deep GaN buffer region under the drain electrode also increases.

Figure 5A:
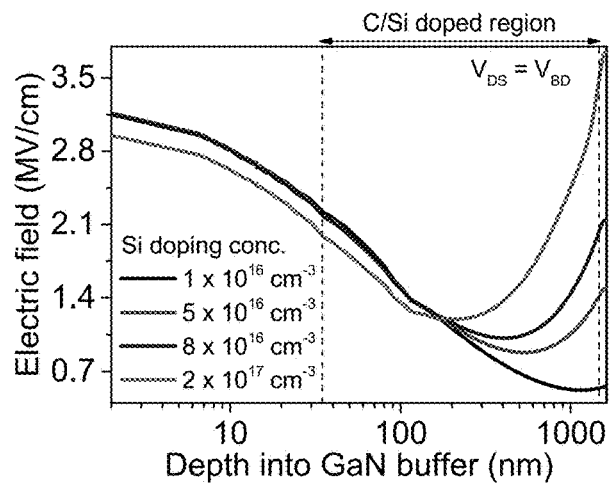
FIG. 5A illustrates the vertical electric field profile near the drain edge, with increase in silicon doping concentration.

FIG. 5A illustrates the vertical electric field profile near the drain edge, with increase in silicon doping concentration. In an embodiment, the vertical electric field profile is extracted at the onset of avalanche breakdown, and the avalanche hot-spot is observed near the drain edge. Additionally, the vertical electric field extracted along a cut line near the drain edge indicates that, as silicon doping concentration in the GaN buffer is increased, there is an increased redistribution of electric field in the complete buffer region.

In another aspect, the voltage handling capacity of the device is improved due to the vertical electric field being effectively redistributed between two electric field peaks, as observed in FIG. 5A.

In another aspect, the vertical field redistribution in the GaN buffer can be attributed to space-charge modulation in the presence of donor traps due to silicon doping, and acceptor traps. In another aspect, the donor and acceptor traps, in their ionised state, provide positive and negative charges respectively, which modulates the space-charge profile in the GaN buffer region, due to which, the electric field distribution is changed.

Figure 5B:
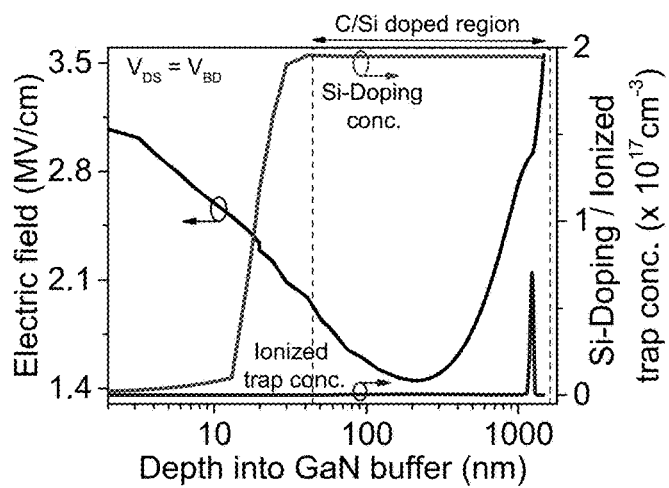
FIG. 5B illustrates the relation of the electric field profile near the drain edge with silicon doping concentration and ionised acceptor trap density.

FIG. 5B illustrates the relation of the electric field profile near the drain edge with silicon doping concentration and ionised acceptor trap density. In another aspect, in order to evaluate the modulation of space-charge profile in the GaN buffer region and the consequent change in electric field distribution, ionised trap density, silicon doping concentration and vertical electric field are extracted along the GaN buffer.

Figure 5C:
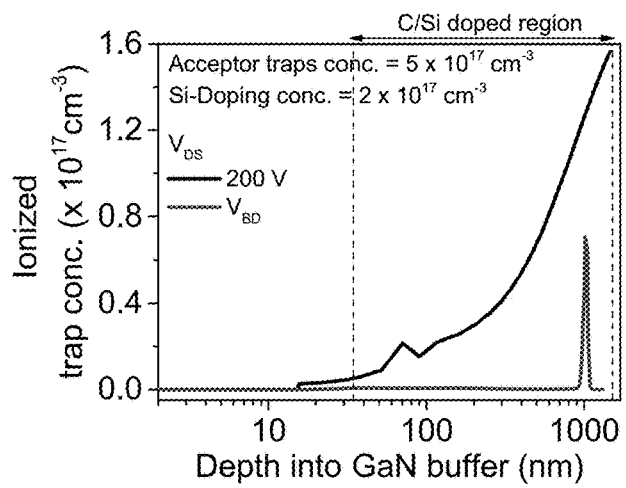
FIG. 5C illustrates the changes in ionised trap concentration and profile as applied drain voltage is changed.

FIG. 5C illustrates the changes in ionised trap concentration and profile as applied drain voltage is changed. In an embodiment, the ionised acceptor trap density value is lowered on application of high drain bias voltage. This drop is attributed to deep energy levels associated with the traps, resulting in the de-trapping of electrons and subsequent movement of the electrons under the applied drain electric field. In another embodiment, the deep energy levels associated with the traps can be located at approximately 0.9 eV above the valence band edge.

Referring once again to FIG. 5B, it is observed that, under the influence of drain field, silicon dopants are completely ionised, and, as drain bias is increased while the silicon dopants are ionised, the ionised acceptor trap concentration in the GaN buffer reduces.

In another aspect, the ionised traps and dopants result in a net positive charge in the deep GaN buffer leading to a redistribution of the electric field, which follows the relation:

$$dE/dx \approx qN_{SiDop}/\varepsilon_{GaN}$$

$N_{SiDop}$—concentration of ionised Silicon dopants;
$\varepsilon_{GaN}$—electric permittivity of GaN.

In another aspect, as the electric field redistributes in the deep GaN buffer, electric field near the drain edge relaxes, resulting in an improved breakdown voltage characteristic of the device.

Referring once again to FIG. 5A, it is observed that the redistribution of vertical electric field in the deep GaN buffer increases with increase in silicon doping concentration, resulting in further improvement of breakdown voltage characteristics of the device. The redistribution of the vertical electric field follows the relation:

$$dE/dx \propto N_{SiDop}$$

Figure 6:
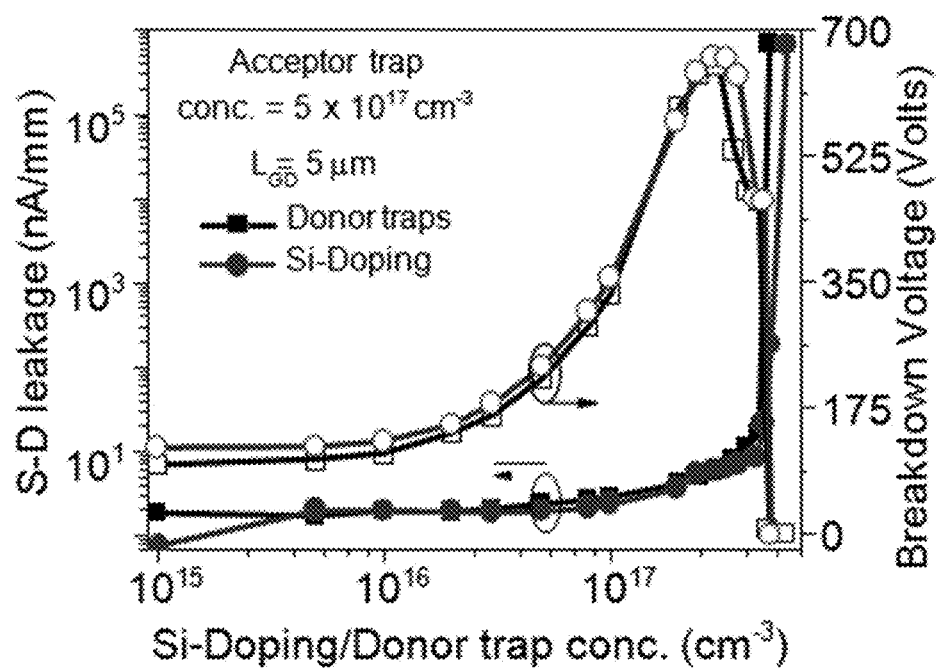
FIG. 6 illustrates a relative comparison of influence of silicon doping concentration with that of donor trap concentration on breakdown voltage and source to drain leakage currents of the device.

FIG. 6 illustrates a relative comparison of influence of silicon doping concentration with that of donor trap concentration on breakdown voltage and source to drain leakage current of the device. In an embodiment, silicon doping concentration is uniform throughout the carbon doped region of the GaN buffer layer.

In another embodiment, FIG. 6 illustrates the comparison of the breakdown voltage improvement for the device, for the following device configurations: device with carbon doping induced acceptor traps along with compensating donor traps; and device with carbon doping induced acceptor traps and silicon doping in the same region for donor traps. In another embodiment, the breakdown voltage for both cases detailed above is similar, thereby suggesting that silicon doping in GaN buffer is effective in independently engineering donor trap concentration in carbon doped GaN buffer. Further, as observed from FIG. 6, the leakage current for both cases detailed above is approximately the same.

Figure 7A:
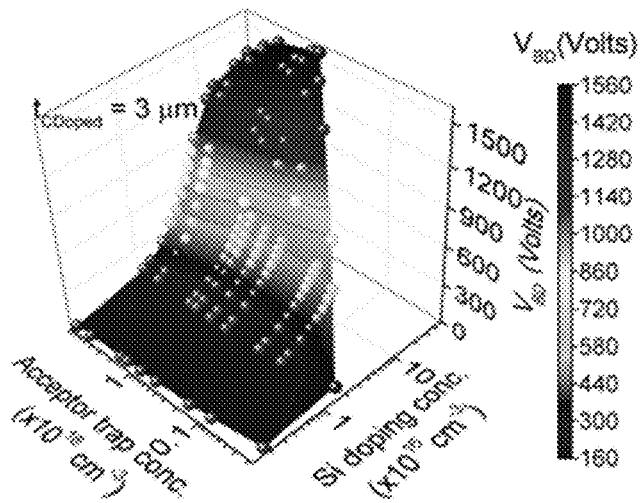
FIGS. 7A-7C illustrate the effect of silicon doping and carbon doping induced acceptor trap concentration on breakdown voltage, leakage current and dynamic ON resistance of the device respectively.
Figure 7B:
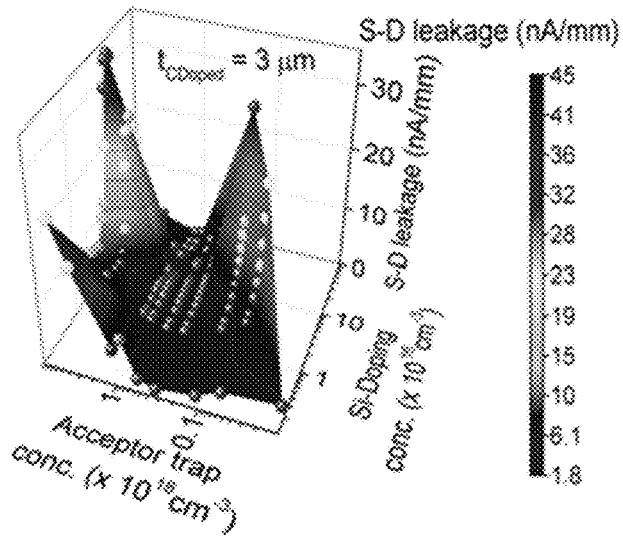
Figure 7C:
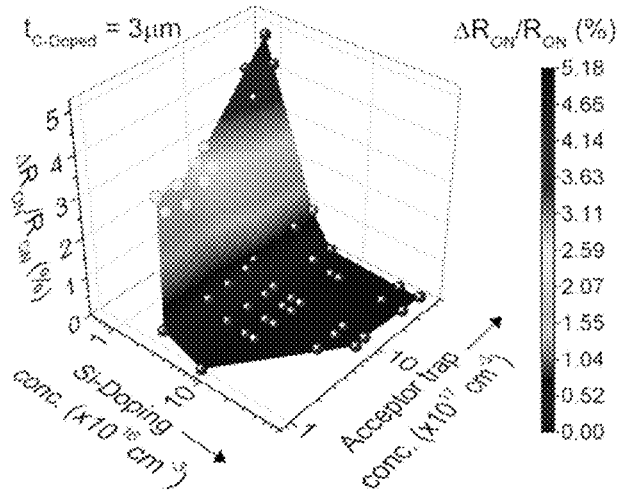

FIGS. 7A-7C illustrate the effect of silicon doping and carbon doping induced acceptor trap concentration on breakdown voltage, leakage current and dynamic ON resistance of the device respectively. In an embodiment, the silicon doping concentration is uniform over the carbon doped area of the GaN buffer. Further, the GaN channel thickness $t_{Channel}$ is considered constant at 35 nm.

In an aspect, leakage current is extracted at: $V_{DS}=V_{BD}/2$.

In another aspect, an objective of the present invention is to achieve a high breakdown voltage without affecting the DC and RF performance of the device. This can be made possible by minimising acceptor trap concentration while maintaining a high breakdown voltage.

In another embodiment, the lateral dimensions of the device are increased to $L_{GD}=10$ μm and $L_{FP}=3$ μm, in order to avoid lateral field driven avalanche phenomena. Further, the carbon doped buffer thickness is increased to 3 μm so as to better estimate the breakdown voltage improvement due to silicon doping.

Referring to FIG. 7A, it is observed that improvement in breakdown voltage, irrespective of acceptor trap concentration, is largely dependent on relative concentration of acceptor traps and silicon doping. Consequently, the breakdown voltage of the device can be retained by maintaining the required silicon doping, even if the carbon doping is reduced.

FIG. 7B illustrates an increased leakage current for the cases: when silicon doping is comparable or greater than acceptor trap concentration; and when acceptor trap concentration is high compared to silicon doping concentration. In an aspect, in the former case, leakage current is due to excess electrons induced by relatively higher silicon doping concentrations. In a further aspect, in the latter case, increased leakage current is due to holes induced by acceptor traps.

FIG. 7C illustrates a percentage change in ON resistance of the device, as a function of silicon doping in the presence of carbon doping induced acceptor traps. In an aspect, a parameter to gauge dynamic performance of the device is the dynamic ON resistance ($R_{dynamic}$) of the device, as given by $$\frac{\Delta R_{ON}}{R_{ON}} = \frac{R_{dynamic} - R_{DC}}{R_{DC}} \times 100\%$$

$R_{DC}$ is the DC ON resistance of the device.

FIG. 7C depicts a significant increase in dynamic ON resistance of the device as acceptor trap concentration increases in the absence of silicon doping. However, as silicon doping concentration is increased, the dynamic ON resistance of the device approaches the DC ON resistance. The improvement in dynamic performance of the device can be attributed to compensation of acceptor traps by n-type silicon dopants resulting in fewer sites to capture channel electrons. Additionally, the relaxation field formed near the drain edge with the increase in donor trap concentrations further reduces trapping of electrons in acceptor traps present in the GaN buffer. This indicates that an optimised silicon doping profile in combination with carbon doping on GaN buffer layer can improve dynamic ON resistance of the device thereby further improving breakdown characteristics of the device.

FIGS. 8A and 8B illustrate total current density and electron current density respectively, when acceptor trap concentration is similar to silicon doping concentration. In an embodiment, the acceptor trap concentration is $1 \times 10^{17}$ cm$^{-3}$ and the silicon doping concentration is $8 \times 10^{16}$ cm$^{-3}$. In another embodiment, when silicon doping is comparable or greater than the acceptor trap concentration, the total current density is dominated by electron current in the channel region.

FIGS. 8C and 8D illustrate the total current density and hole current density respectively, when acceptor trap concentration is significantly higher than silicon doping concentration. In an embodiment, the acceptor trap concentration is $5 \times 10^{18}$ cm$^{-3}$ and the silicon doping concentration is $1 \times 10^{15}$ cm$^{-3}$. In another embodiment, when acceptor trap concentration is high compared to silicon doping concentration, total current density is dominated by hole current in the buffer region.

Figure 9A:
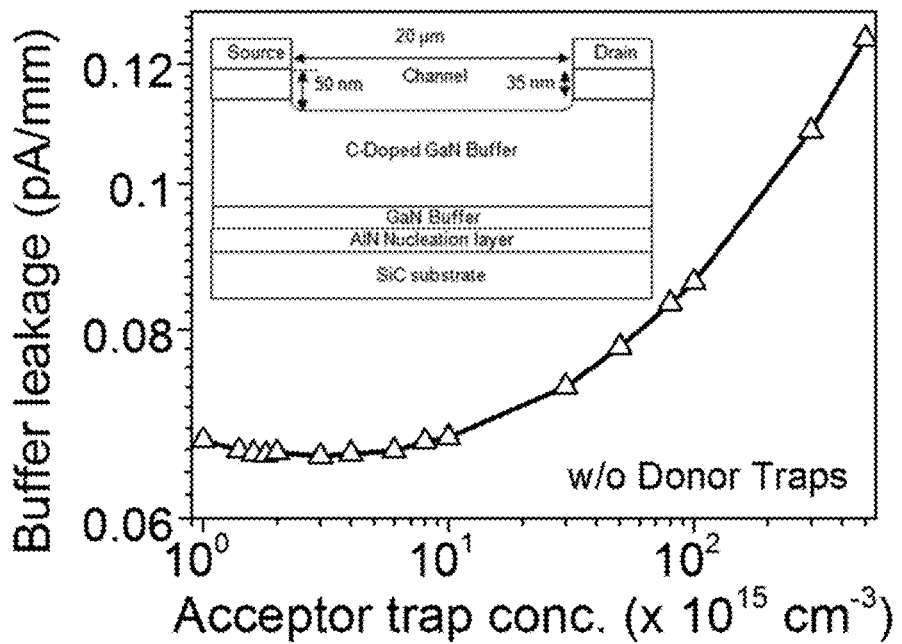
FIGS. 9A and 9B illustrate buffer leakage current as a function of acceptor trap concentration in absence of donor traps and as a function of donor trap concentration for a fixed acceptor trap concentration, respectively.
Figure 9B:
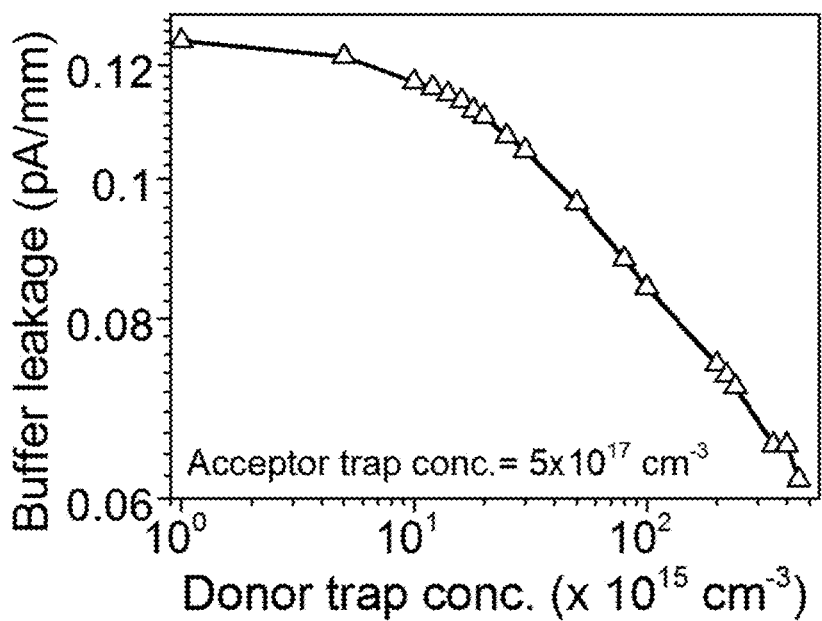

FIGS. 9A and 9B illustrate buffer leakage current as a function of acceptor trap concentration in absence of donor traps and as a function of donor trap concentration for a fixed acceptor trap concentration, respectively. In an aspect, the leakage current is extracted at 50% voltage value of the breakdown voltage.

In an embodiment, FIG. 9A also illustrates an exemplary structure used for simulating buffer leakage current.

In another embodiment, the buffer leakage is orders of magnitude smaller than S/D leakage. It can be inferred from this that carbon doping acts as a back barrier as well, which improves the gate control over the channel by confining the two-dimensional electron gas (2DEG) closer to AlGaN barrier, thereby lowering S/D leakage current.

In another embodiment, it can be inferred that S/D leakage along with breakdown voltage can be used as a better measure to optimise carbon doping and stack design in the device. Referring once again to FIGS. 7A and 7B, it is noted that an optimum design window for relative carbon doping concentration and silicon doping concentration can be extracted to maximise breakdown voltage and minimise leakage current. In another embodiment, optimised design parameters are acceptor trap concentration of $5 \times 10^{17}$ cm$^{-3}$ and silicon doping concentration of $2 \times 10^{17}$ cm$^{-3}$.

Figure 10A:
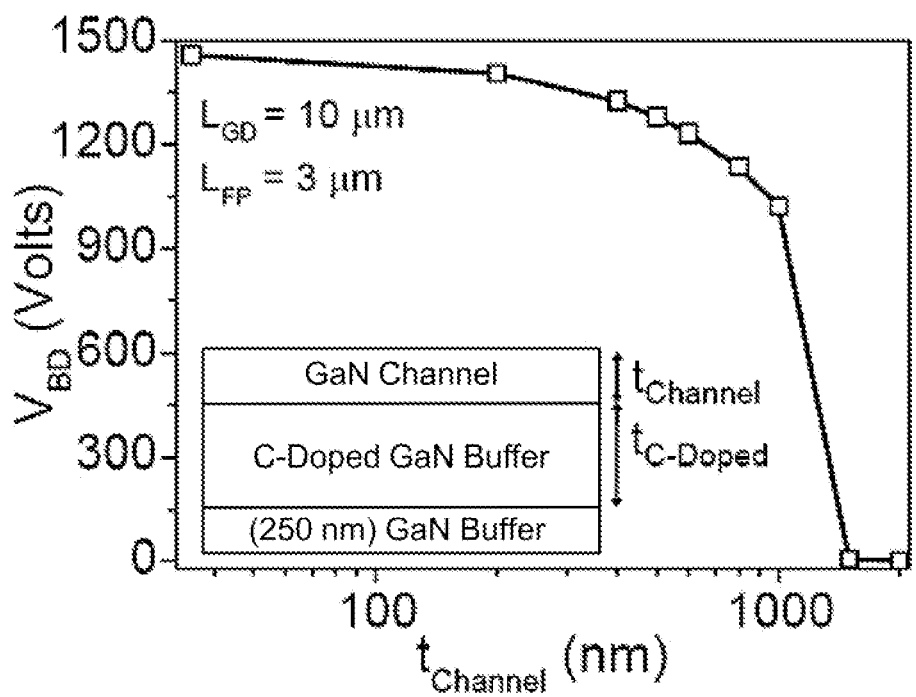
FIGS. 10A and 10B illustrate the effect of channel thickness ($t_{Channel}$) on breakdown voltage and source-drain leakage current respectively.
Figure 10B:
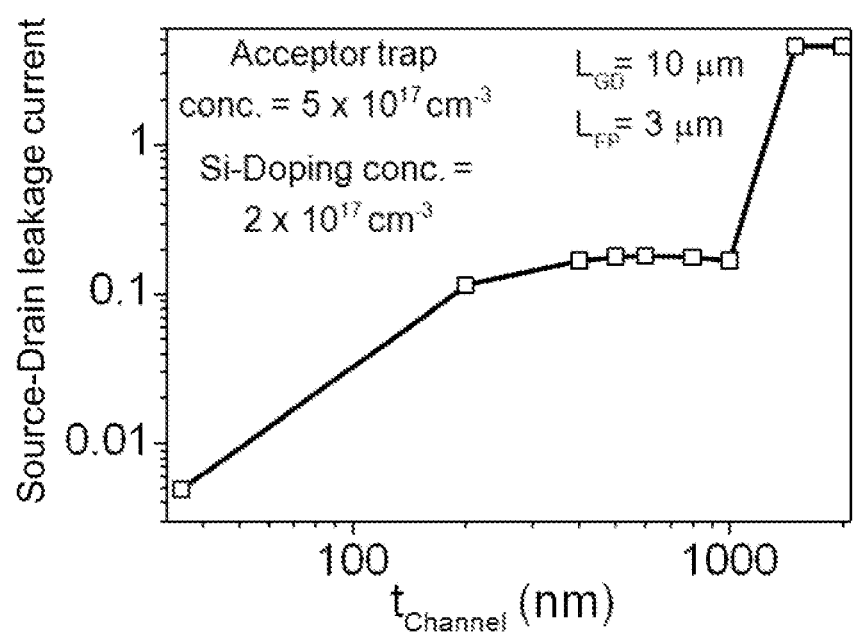

FIGS. 10A and 10B illustrate the effect of channel thickness ($t_{Channel}$) on breakdown voltage and source-drain leakage current respectively.

In an aspect, doping by carbon and silicon induces charged ions in the GaN buffer. Considering the detrimental effect of acceptor traps on channel electron density, it is beneficial to have a thicker, undoped channel region to minimise impact on channel electron mobility and density. In an embodiment, the total thickness of the GaN buffer is kept constant at 3 µm. As $t_{Channel}$ is increased, $t_{C-Doped}$ is reduced to maintain a constant total buffer thickness. Further, silicon doping and acceptor concentrations are uniform in the carbon doped region of GaN buffer.

FIG. 10A illustrates a comparison of breakdown characteristics of the device for different channel thicknesses. With increasing channel thickness, a sub-linear reduction in breakdown voltage is observed. However, this trend holds true for increasing channel thickness up to 1 µm. As channel thickness increases to above 1 µm, a sharp reduction in breakdown voltage is observed. It is also noted that for a channel thickness of up to approximately 250 nm, breakdown voltage remains largely unchanged.

FIG. 10B illustrates a comparison of source-drain leakage current for different channel thicknesses. With an increasing channel thickness greater than 1 µm, a sharp increase in leakage current is observed.

In another aspect, a device with a desired performance can be engineered by selecting an optimum value for channel thickness. Further, it is expected that a thicker channel reduces the impact of silicon doping on channel mobility, thereby reducing ON resistance.

Figure 11A:
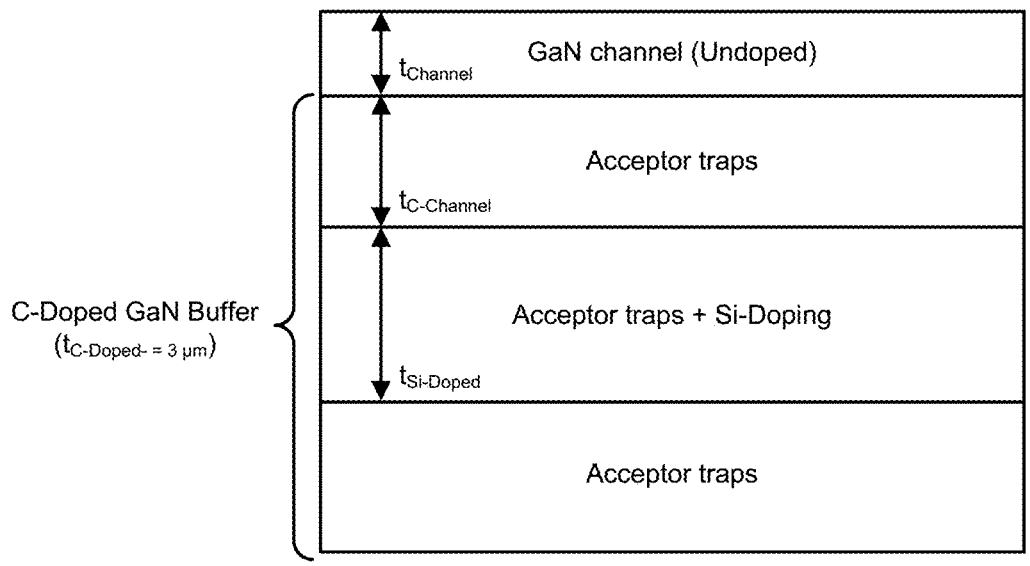
FIG. 11A illustrates the exemplary carbon doped buffer stack below the undoped GaN channel, with engineered silicon and carbon doping profiles.

FIG. 11A illustrates the exemplary carbon doped buffer stack below the undoped GaN channel, with engineered silicon and carbon doping profiles. In an embodiment, the carbon doped buffer region comprises a silicon co-doped region sandwiched between regions with only carbon doping.

In an aspect, as previously elucidated, a thinner GaN channel allows maintenance of high breakdown voltage in the device, while a thicker channel shifts the silicon doped region away from 2DEG and minimises its adverse impact on 2DEG mobility. In a further aspect, silicon doping also causes redistribution of electric field in the deep GaN buffer region, which is independent of carbon doping and enables independent control over trap profiles.

In another embodiment, the proposed carbon doped GaN buffer with acceptor traps is of a constant thickness of 3 µm. The silicon co-doped region is buried between carbon doped regions within the buffer layer, with thickness $t_{Si-Doped}$, located at a depth $t_{C-Channel}$ from the top of the carbon doped GaN buffer layer. In another embodiment, the GaN channel thickness ($t_{Channel}$), without considering either silicon or carbon doping, is fixed at 35 nm.

In an aspect, acceptor traps are responsible for restricting leakage through the buffer and silicon doping is responsible for vertical field redistribution in the deep GaN buffer.

In another embodiment, the proposed doping profile is expected to maintain a high breakdown voltage where the silicon doped region can be moved away from the GaN channel to minimise its impact on channel mobility.

Figure 11B:
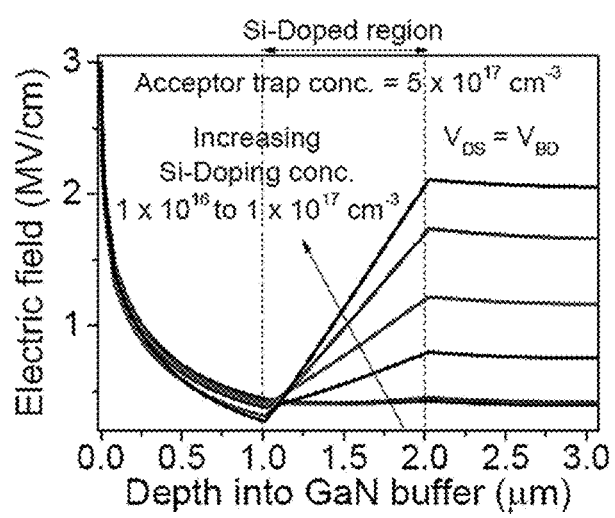
FIG. 11B illustrates the effect of increasing silicon doping concentration on vertical electric field distribution, in the case of the proposed modified doping profile.

FIG. 11B illustrates the effect of increasing silicon doping concentration on vertical electric field distribution, in the case of the proposed modified doping profile. In an embodiment, field redistribution increases in the deep GaN region where both acceptor traps and silicon doping are considered. Where silicon doping is not considered, there is no such redistribution of electric field.

In another aspect, the field redistribution profiles as described above is explained using the ionised acceptor trap concentration and silicon doping profile in the buffer region, which collectively define the space-charge profile.

Figure 12A:
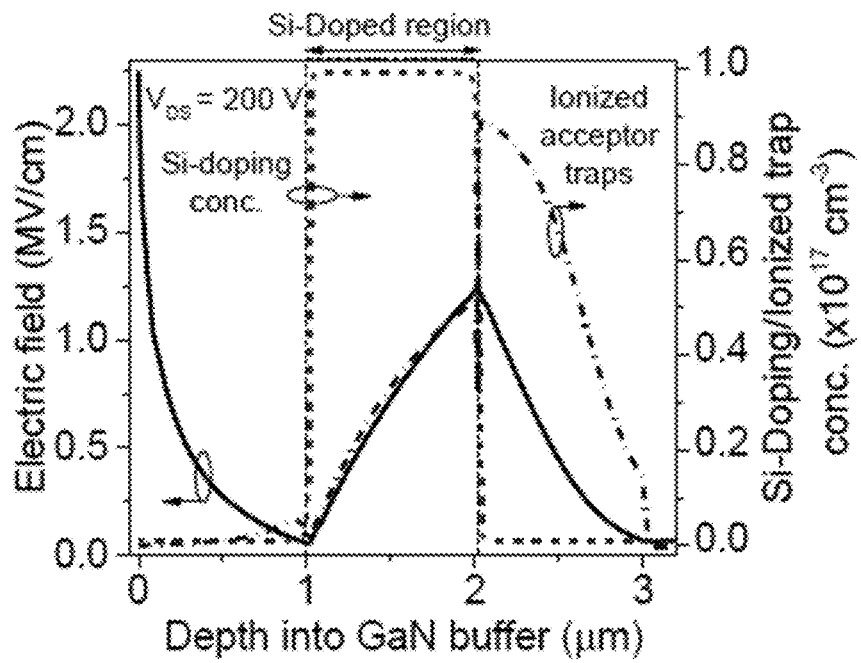
FIG. 12A illustrates the vertical field under the drain edge plotted with silicon doping and ionised acceptor trap concentration, extracted for the GaN buffer with the proposed doping profile.

FIG. 12A illustrates the vertical field under the drain edge plotted with silicon doping and ionised acceptor trap concentration, extracted for the GaN buffer with the proposed doping profile. In an aspect, the silicon doping and ionised acceptor trap concentration together define the space-charge profile.

In an embodiment, FIG. 12A depicts one such space-charge profile along with vertical electric field in the GaN, which is extracted at a drain bias voltage of 200 V. A significant redistribution of electric field is observed in the region where silicon doping and acceptor traps are present. This implies that, within said region, the silicon doping dominates the ionised acceptor trap concentration.

In another aspect, the silicon doping offers positive charge and the ionised acceptor traps offer a negative charge. In another embodiment, the profile, as described above, gives rise to a net positive charge in the region with silicon doping, as a result of which, electric field redistributes in this region.

Figure 12B:
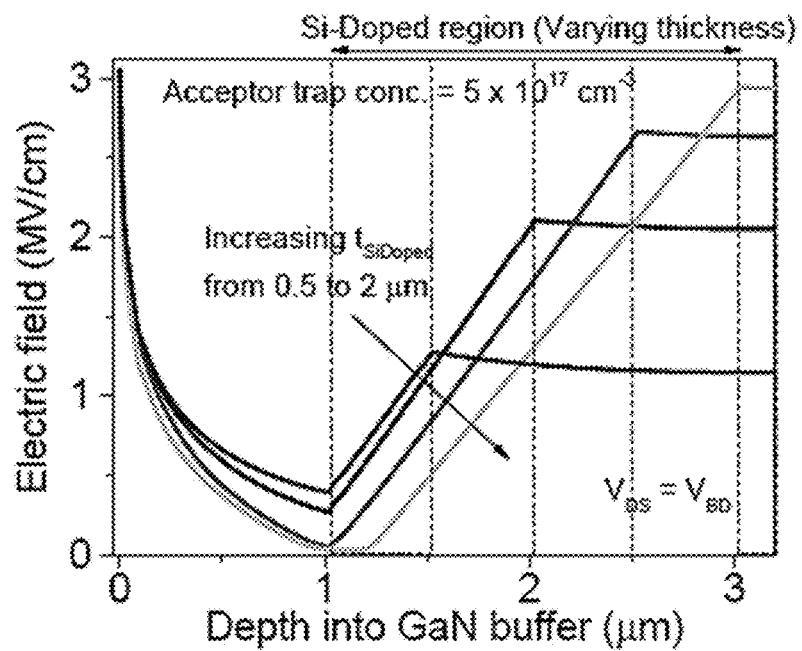
FIG. 12B illustrates the effect of thickness of the silicon doped region on vertical field profile, extracted at the onset of avalanche phenomenon.

FIG. 12B illustrates the effect of thickness of the silicon doped region on vertical field profile, extracted at the onset of avalanche phenomenon. In an embodiment, a constant silicon doping concentration of $1 \times 10^{17}$ cm$^{-3}$ and a constant acceptor trap concentration of $5 \times 10^{17}$ cm$^{-3}$ are maintained.

In another embodiment, the net positive charge of the proposed doping profile is limited to the regions with silicon doping, and therefore, the electric field redistribution is limited to said region as well. FIG. 12B shows an increased redistribution of electric field in the deep GaN buffer when there is an increase in the thickness of silicon doped region ($t_{Si\text{-}Doped}$).

Figure 13A:
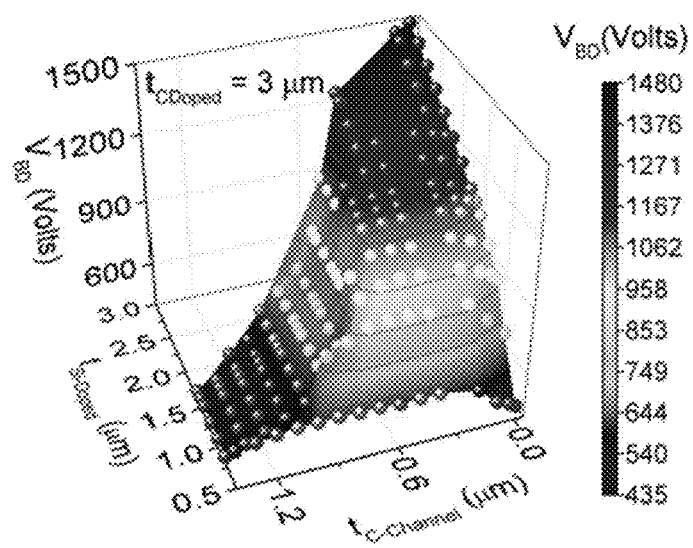
FIGS. 13A and 13B illustrate the effect of channel thickness and thickness of silicon doped region on breakdown voltage and source-drain leakage current respectively, in the device.
Figure 13B:
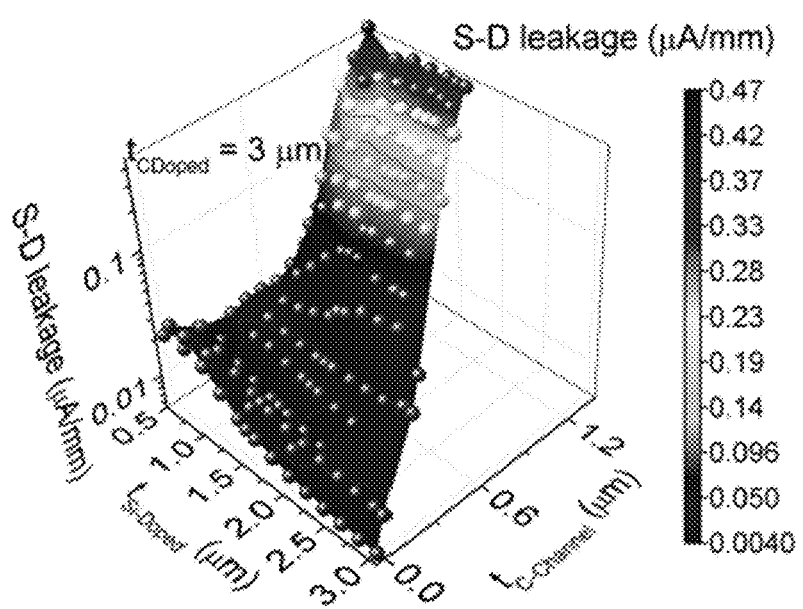

FIGS. 13A and 13B illustrate the effect of channel thickness ($t_{C\text{-}Channel}$) and thickness of silicon doped region ($t_{Si\text{-}Doped}$) on breakdown voltage and source-drain leakage current respectively, in the device. In an embodiment, acceptor trap concentration is of $5 \times 10^{17}$ cm$^{-3}$ and silicon doping concentration is of $2 \times 10^{17}$ cm$^{-3}$.

Referring to FIG. 13A, an improvement in breakdown voltage is seen with increase in $t_{Si\text{-}Doped}$, which can be attributed to extended space-charge region deep in the GaN buffer. On the other hand, for an increase up to approximately 400 nm of $t_{C\text{-}Channel}$, the breakdown voltage is independent of $t_{C\text{-}Channel}$ and doesn't vary significantly.

Referring to FIG. 13B, when $t_{C\text{-}Channel}$ is increased up to approximately 400 nm, a controlled leakage current is observed, which increases exponentially as $t_{C\text{-}Channel}$ is further increased, and negatively impacts the breakdown voltage of the device. This phenomenon can be attributed to the presence of a high concentration of uncompensated acceptor traps in the carbon doped region devoid of silicon doping, which leads to an increase in leakage current.

Figure 14A:
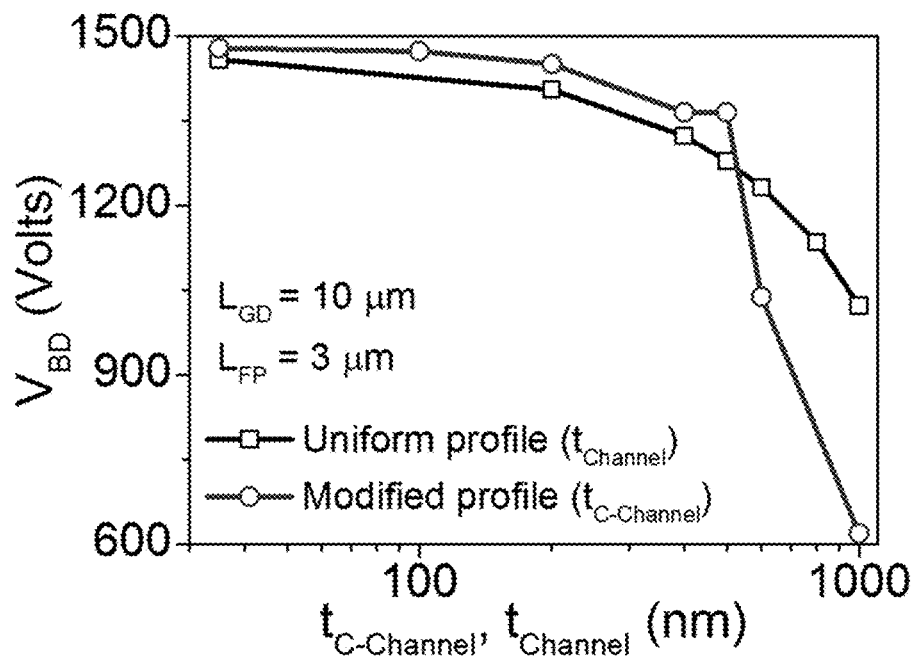
FIGS. 14A and 14B illustrate the relationship of breakdown voltage and leakage current respectively of the device with silicon doping profile of the GaN buffer.
Figure 14B:
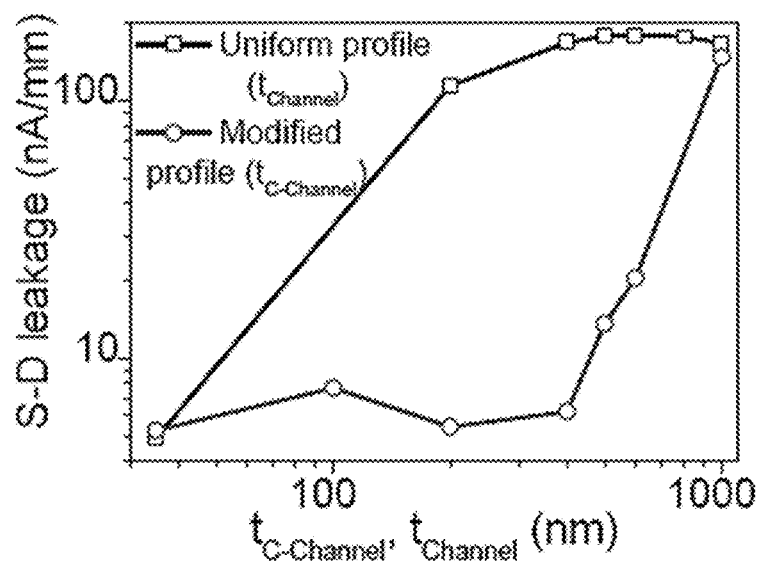

FIGS. 14A and 14B illustrate the relationship of breakdown voltage and leakage current respectively of the device with silicon doping profile of the GaN buffer. In an embodiment, acceptor trap concentration is of $5 \times 10^{17}$ cm$^{-3}$ and silicon doping concentration is of $2 \times 10^{17}$ cm$^{-3}$.

In an aspect, for the device to perform as desired, the doped region is recommended to be kept away from 2DEG, irrespective of the doping profile of the GaN buffer.

FIGS. 14A and 14B depict a comparison of breakdown voltage and leakage current respectively, when channel thickness is varied. In an embodiment, two stack configurations are considered for the comparison: with uniform acceptor trap and silicon doping concentrations in the complete carbon doped GaN buffer, $t_{Channel}$ being a design variable; and with the proposed modified doping profile with fixed $t_{Channel}$ of 35 nm and where $t_{C\text{-}Channel}$ is a design variable.

In another embodiment, with an increase in $t_{Channel}$, $t_{C\text{-}Doped}$ is reduced in order to maintain a constant buffer thickness. Similarly, as $t_{C\text{-}Channel}$ is increased, $t_{Si\text{-}Doped}$ in reduced while $t_{C\text{-}Doped}$ is kept unchanged so that the following relation is satisfied: $t_{C\text{-}Channel} + t_{Si\text{-}Doped} = t_{C\text{-}Doped}$.

In another embodiment, in case of the proposed silicon doping profile and $t_{Channel}$ as high as approximately 400 nm, superior breakdown and leakage characteristics are observed. In comparison, when standard doping profile is used, even a marginal increase in $t_{Channel}$ results in a significant increase in leakage current.

Figure 15A:
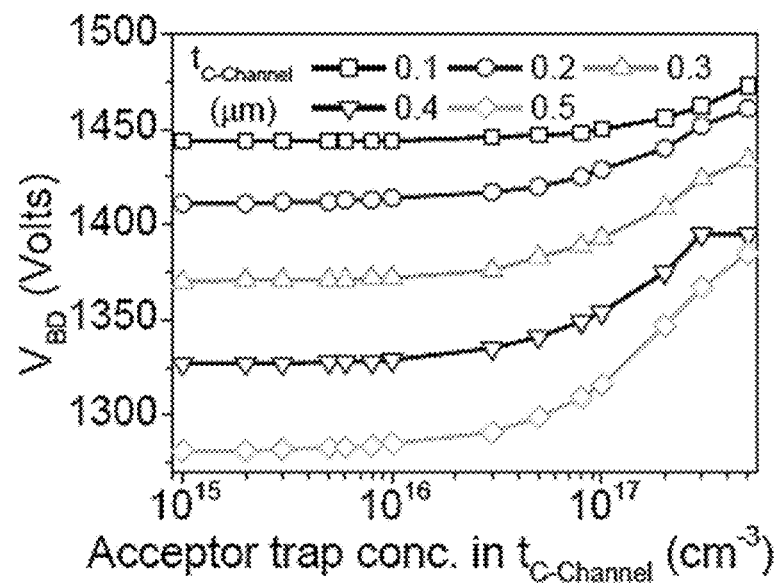
FIGS. 15A and 15B illustrate the trends in the variation of breakdown voltage and source-drain leakage current respectively, with acceptor trap concentration in the channel region above the silicon doped region in the proposed stack.
Figure 15B:
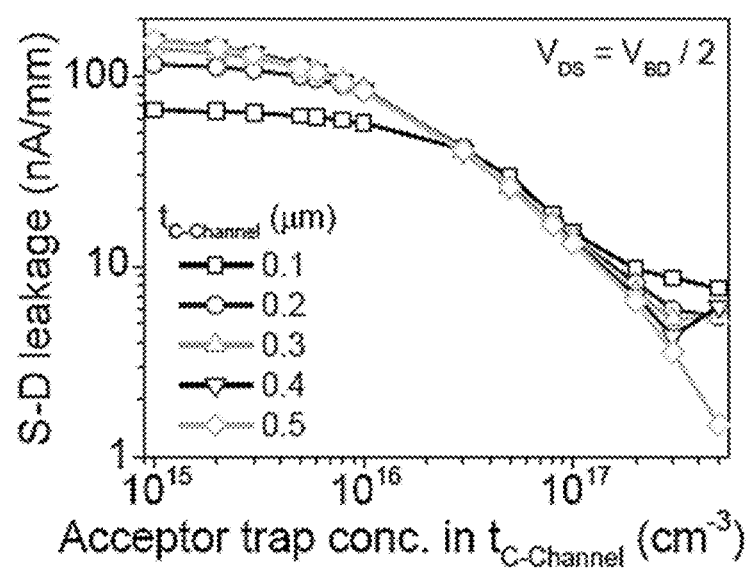

FIGS. 15A and 15B illustrate the trends in the variation of breakdown voltage and source-drain leakage current respectively, with acceptor trap concentration in the channel region above the silicon doped region in the proposed stack. In an embodiment, silicon doping concentration is $2 \times 10^{17}$ cm$^{-3}$. Total buffer thickness is kept constant at 3 μm and $t_{Channel}$ at 35 nm. Lateral dimensions are kept constant with LGD at 10 μm and LFP at 3 μm.

In an aspect, the proposed modified silicon doping profile leaves a channel region above the silicon doped region, where only acceptor traps exist. In an embodiment, as described previously, the thickness of this channel region can be increased up to approximately 500 nm with a very small decrease in breakdown voltage.

In another aspect, the majority of vertical field relaxation occurs in the silicon doped region and the acceptor trap concentration in the channel is primarily responsible for controlling the resistivity of the GaN buffer. Thus, the acceptor trap concentration, or carbon doping in this channel region can be further reduced without affecting the breakdown voltage.

Referring FIGS. 15A and 15B, for the case as discussed above, the breakdown voltage shows very little reduction with reduction in acceptor trap concentration. There is, however, a marginal increase in leakage current.

In an aspect, the marginal reduction of breakdown voltage with increasing channel thickness is ascribed to the reduction in thickness of silicon doped region. In another aspect, the marginal increase in leakage current with reduction in acceptor trap concentration is due to reduced channel resistivity.

Thus, the proposed GaN buffer layer with a silicon co-doping profile has independently controllable donor and acceptor trap concentrations, thereby able to improve breakdown voltage while minimising any detriments to device performance. Further, the performance improvement with carbon and silicon co-doping of GaN buffer can be achieved independent of the gate topology, i.e., the said performance improvement is applicable to devices having different gate structures.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages

The present disclosure provides a high electron mobility transistor (HEMT) with improved breakdown voltage characteristics.

The present disclosure provides an HEMT with minimised leakage current.

The present disclosure provides an HEMT with minimized dynamic ON resistance.

The present disclosure provides a doping methodology for the HEMT for better performance.

The present disclosure provides a doping methodology for the HEMT to independently control donor and acceptor trap concentrations.

We claim:

1. A transistor with improved breakdown voltage, said transistor having an AlGaN barrier layer and a GaN buffer layer, wherein compensation C-doping is performed in said GaN buffer layer for controlling acceptor trap concentration in said GaN buffer layer, and thereafter an intentional n-type doping is performed in said GaN buffer layer for controlling donor trap concentration in said GaN buffer layer,
wherein the intentional n-type doping comprises Si-doping, and wherein the Si-doping is optimized based on dynamic ON resistance.

2. The transistor as claimed in claim 1, wherein said transistor is a HEMT transistor.

3. The transistor as claimed in claim 1, wherein the intentional n-type doping is performed based on free hole density and ionized acceptor trap density in said GaN buffer layer.

4. The transistor as claimed in claim 1, wherein a region where the intentional n-type doping is performed at least partially overlaps with an area where the compensation C-doping is performed.

5. The transistor as claimed in claim 1, wherein said acceptor trap concentration is minimized while maintaining high breakdown voltage.

6. The transistor as claimed in claim 1, wherein the compensation C-doping is optimized based on any or a combination of Source/Drain leakage and breakdown voltage.

7. The transistor as claimed in claim 1, wherein channel thickness of said transistor is controlled based on impact of the intentional n-type doping on channel mobility.

8. The transistor as claimed in claim 1, wherein said compensation C-doping is optimally reduced so as to not impact the improved breakdown voltage beyond a defined threshold.

9. A method for improving breakdown voltage in a transistor, the method comprising:
   providing an AlGaN barrier layer and a GaN buffer layer in the transistor;
   performing compensation C-doping and intentional n-type doping in the GaN buffer layer, wherein the intentional n-type doping comprises Si-doping, and wherein the Si-doping is optimized based on dynamic ON resistance; and
   controlling acceptor trap concentration in the GaN buffer layer based on the compensation C-doping and controlling donor trap concentration based on the intentional n-type doping.

10. The method as claimed in claim 9, wherein the method further comprises:
    upon the intentional n-type doping, changing parasitic electron and hole density in the GaN buffer layer; and
    modulating, as an ionized dopant, space charge distribution and vertical electrical field in the GaN buffer layer.

11. The method as claimed in claim 9, wherein the improvement in breakdown voltage is dependent on relative concentration of acceptor traps and the intentional n-type doping.

12. The method as claimed in claim 9, wherein the intentional n-type doping is performed based on free hole density and ionized acceptor trap density in said GaN buffer layer.

13. The method as claimed in claim 9, wherein a region where the intentional n-type doping is performed at least partially overlaps with an area where the compensation C-doping is performed.

* * * * *